United States Patent
Klose et al.

(10) Patent No.: US 9,738,530 B2
(45) Date of Patent: Aug. 22, 2017

(54) POLYCRYSTALLINE SILICON DEPOSITION METHOD

(71) Applicant: Wacker Chemie AG, Munich (DE)

(72) Inventors: Goeran Klose, Hirten (DE); Heinz Kraus, Zeilarn (DE); Tobias Weiss, Mehring (DE)

(73) Assignee: WACKER CHEMIE AG, Munich (DE)

( * ) Notice: Subject to any disclaimer, the term of this patent is extended or adjusted under 35 U.S.C. 154(b) by 0 days.

(21) Appl. No.: 14/777,643

(22) PCT Filed: Feb. 26, 2014

(86) PCT No.: PCT/EP2014/053734
§ 371 (c)(1),
(2) Date: Sep. 16, 2015

(87) PCT Pub. No.: WO2014/146876
PCT Pub. Date: Sep. 25, 2014

(65) Prior Publication Data
US 2016/0297684 A1 Oct. 13, 2016

(30) Foreign Application Priority Data
Mar. 18, 2013 (DE) .................. 10 2013 204 730

(51) Int. Cl.
*C01B 33/035* (2006.01)
*C23C 16/455* (2006.01)
(52) U.S. Cl.
CPC .......... *C01B 33/035* (2013.01); *C23C 16/455* (2013.01)

(58) Field of Classification Search
CPC ...................................................... C01B 33/35
See application file for complete search history.

(56) References Cited

U.S. PATENT DOCUMENTS

| 3,222,217 A * | 12/1965 | Grabmaier ............ C01B 33/035 118/726 |
| 4,147,814 A * | 4/1979 | Yatsurugi .............. C01B 33/035 118/725 |
| 2004/0129211 A1 | 7/2004 | Blonigan et al. |
| 2005/0201908 A1 | 9/2005 | Nakamura et al. |
| 2009/0136408 A1 | 5/2009 | Endoh et al. |
| 2011/0229638 A1 | 9/2011 | Qin |
| 2011/0281029 A1 | 11/2011 | Honda et al. |
| 2012/0148728 A1 | 6/2012 | Canle et al. |

(Continued)

FOREIGN PATENT DOCUMENTS

| AT | 220591 B | 4/1962 |
| CN | 101537328 | 9/2009 |
| CN | 201313954 Y | 9/2009 |

(Continued)

OTHER PUBLICATIONS

Kang (International Journal of Photoenergy, vol. 2012 (2012), Article ID 697653).*

*Primary Examiner* — Joel Horning
(74) *Attorney, Agent, or Firm* — Brooks Kushman P.C.

(57) ABSTRACT

The deposition of polycrystalline silicon onto heated filament rods in a Siemens process is improved by supplying reaction gas at least partially through nozzles in the vertical wall of the deposition reactor, at an angle of 0° to 45° to the reactor wall, towards the base plate of the reactor.

12 Claims, 5 Drawing Sheets

(56) References Cited

U.S. PATENT DOCUMENTS

2014/0134832 A1\* 5/2014 Kurosawa ............. C01B 33/035
　　　　　　　　　　　　　　　　　　　　438/488

FOREIGN PATENT DOCUMENTS

| CN | 102245800 A | 11/2011 |
| --- | --- | --- |
| DE | 64047 A | 10/1968 |
| JP | 2002241120 A | 8/2002 |
| TW | 200416297 | 9/2004 |
| TW | 201246290 A1 | 11/2012 |
| WO | 2006110481 A2 | 10/2006 |
| WO | 2013125209 A1 | 8/2013 |

\* cited by examiner

POLYCRYSTALLINE SILICON DEPOSITION METHOD

CROSS REFERENCE TO RELATED APPLICATIONS

This application is the U.S. National Phase of PCT Appln. No. PCT/EP2014/053734 filed Feb. 26, 2014, which claims priority to German Application No. 10 2013 204 730.4 filed Mar. 18, 2013, the disclosures of which are incorporated in their entirety by reference herein.

BACKGROUND OF THE INVENTION

1. Field of the Invention

High-purity polycrystalline silicon (polysilicon) serves as a starting material for production of monocrystalline silicon for semiconductors by the Czochralski (CZ) or zone melting (FZ) processes, and for production of mono- or polycrystalline silicon by various pulling and casting processes for production of solar cells for photovoltaics.

2. Description of the Related Art

Polysilicon is typically produced by means of the Siemens process. This involves introducing a reaction gas comprising one or more silicon-containing components and optionally hydrogen into a reactor comprising support bodies heated by direct passage of current, silicon being deposited in solid form on the support bodies. The silicon-containing components used are preferably silane ($SiH_4$), monochlorosilane ($SiH_3Cl$), dichlorosilane ($SiH_2Cl_2$), trichlorosilane ($SiHCl_3$), tetrachlorosilane ($SiCl_4$) or mixtures of the substances mentioned.

The Siemens process is typically conducted in a deposition reactor (also called a "Siemens reactor"). In the most commonly used embodiment, the reactor comprises a metallic base plate and a coolable bell jar placed onto the base plate so as to form a reaction space within the bell jar. The base plate is provided with one or more gas inlet orifices and one or more offgas orifices for the departing reaction gases, and with holders which help to hold the support bodies in the reaction space and supply them with electrical current.

Each support body usually consists of two thin filament rods and a bridge which connects generally adjacent rods at their free ends. The filament rods are most commonly manufactured from mono- or polycrystalline silicon; less commonly, metals, alloys or carbon are used. The filament rods are inserted vertically into electrodes present at the reactor base, through which they are connected to the power supply. High-purity polysilicon is deposited on the heated filament rods and the horizontal bridge, as a result of which the diameter thereof increases with time. Once the desired diameter has been attained, the process is stopped.

JP 2002241120 A2 discloses a deposition reactor in which reaction gas is introduced at the top. The reaction gas mixes above the silicon rods with ascending reaction gas and then descends at the reactor wall.

In the course of this, fresh gas in a first embodiment is injected at the top of the reactor in the direction of the base plate, and in a 2nd embodiment at the upper end of the cylindrical reactor section radially from the reactor wall in horizontal direction toward the center of the reactor. Reaction gas ascending as a result of natural convection at the hot rod surface is supposed to mix with cold descending fresh gas. The descending fresh gas causes a countercurrent flow to the ascending reaction gas.

This creates a gas backup; the formation of additional gas vortexes and heating of the reaction gas, popcorn growth and/or dust deposition are the result. The specific energy demand cannot be reduced in this way.

DD 64047 A describes a process for producing polysilicon, in which the reaction gas is introduced at the top of the reaction chamber via a gas line for protection of the wall from deposits.

AT 220591 B discloses a vessel for production of high-purity silicon, in which the input gas is blown directly onto the heated silicon rod along various rod positions.

CN 201313954 Y discloses a deposition reactor in which reaction gas is injected centrally from the top, and laterally from the bottom. The gas flow generated is supposed to reduce the thickness of the gas interface layer at the silicon rod. More rapid and homogeneous silicon growth would be the result. The injection centrally from the top and laterally from the bottom described in CN201313954 Y results in a strong current toward the silicon rod bridges. A disadvantage of this process is that the opposing gas flows from the bottom and the top cancel out the gas pulses therein. This results in thicker interface layers at the silicon rods, which cause inhomogeneous and slower silicon growth on the rods.

Injection from the side (as described in AT220591 B) directly (vertically) onto the silicon rod leads inevitably to inhomogeneous rod growth and corresponding "dents" in the silicon rod.

US 2011229638 A2 describes a process for polysilicon deposition, wherein the reactor is operated with various nozzle groups which can be charged at different mass flow rates.

A standard way of producing polysilicon is to use deposition reactors in which the reaction gas is injected via nozzles in the lower section, called the base plate.

With increasing reactor diameter and increasing reactor height, it is necessary to inject correspondingly large amounts of reaction gas into the reactor with correspondingly adjusted pulse flow rate, in order to generate a sufficiently developed circulation flow in the reactor. The downward flow is at the reactor wall.

The high reaction gas and pulse flow rates required can lead to thermal stress on the silicon rods in the reactor. This is manifested by inhomogeneous rods, undesirable rod morphology (popcorn) and cracks/rod flaking. Regions with a very rough surface ("popcorn") have to be separated at a later stage from the rest of the material, which is disadvantageous and worsens the yield.

Cracked and flaking rods can lead to electrical failure of the plant. Plant shutdowns and material wastage lead to higher production costs.

One cause of energy consumption in deposition plants is the convective release of heat via the reaction gas to the cooled reactor wall. This problem gave rise to the following objective of the invention: the reaction gas has to be introduced into the reactor in such a way that a maximum feed mass flow rate causes relatively low thermal stress on the rods. The heat loss via the wall resulting from the gas flow in the reactor is to be minimized.

SUMMARY OF THE INVENTION

This and other objects are achieved by a process for depositing polycrystalline silicon in a reactor bounded laterally and at the top by a reactor wall and at the bottom by a base plate on which are mounted filament rods which are heated, with introduction of a silicon-containing reaction gas mixture into the reactor chamber by means of gas inlet orifices on the reactor wall and in the base plate, and with deposition of silicon on the filament rods, wherein silicon-containing reaction gas mixture is introduced at an angle of declination of 0-45° relative to the lateral reactor wall through gas inlet orifices in the reactor wall.

DETAILED DESCRIPTION OF THE PREFERRED EMBODIMENTS

It has been found that such a wall injection of the present invention, at an angle of 0°-45° relative to the lateral wall (=cylindrical part of the bell jar), supports or maintains the circulation flow of the gas.

Typically, the gas inlet orifices are holes. The geometry of the hole may be selected as desired.

The invention is also illustrated hereinafter with reference to—FIGS. 1-8.

A hole may have two different angles relative to the lateral reactor wall. Such an embodiment can be found in FIG. 3. Both the minimum hole angle and the maximum hole angle may vary only within the angle range of 0-45°, in order to ensure that the reaction gas mixture is introduced at an angle of 0°-45° relative to the lateral reactor wall.

By virtue of the reaction gas mixture being introduced at an angle of 0-45° relative to the lateral reactor wall, a wall film is simultaneously produced, which distinctly reduces convective heat exchange with the reactor wall. This wall film is a continuous gas film which forms from the reaction gas injected from the outside and flows from the top downward along the inner reactor wall. For this purpose, gas inlet orifices or entry orifices mounted on the reactor wall allow the application of a continuous wall film.

The reactor has a bell jar-shaped geometry (cylinder+ hemisphere, ellipsoidal head, torispherical head or similar designs) and is bounded laterally by a cylindrical reactor wall or another kind of reactor wall, at the top by reactor wall or bell jar wall, and at the bottom by the base plate.

The uppermost entry orifices are within a region between 40% and 100% of the height above the base plate based on the height of the vertical reactor wall, preferably between 70% and 100%.

Preferably, a ratio $A_{inl}/A_{reac}$ between an area of an individual inlet orifice $A_{inl}$ and a cross-sectional area of the reactor interior $A_{reac}$ is greater than $10^{-6}$ and less than 1/1600, more preferably $1/200\,000 < (A_{inl})/(A_{reac}) < 1/2500$; and most preferably $1/50\,000 < (A_{inl})/(A_{reac}) < 1/5000$.

$A_{inl}$ corresponds to an area of an entry orifice in the reactor wall; $A_{reac}$ corresponds to a cross-sectional area of the reactor, formed by the internal reactor diameter D, i.e. $A_{reac} = D^2/4 * \pi$).

Typically, the entry orifices are distributed homogeneously over the circumference, but they may also be arranged inhomogeneously.

The hole is typically circular in shape, but may also have other shapes (e.g. elliptical or the like) and combinations thereof.

It is likewise possible to use several different hole forms in one reactor (e.g. circular and elliptical).

The direct distance a of the holes (outer edge to outer edge; see—FIGS. 4-6) from one another is at least 3 mm, preferably at least 10 mm, more preferably at least 20 mm. This gives rise to a gas film which is homogeneously continuous over the circumference and minimizes the heat losses via the wall.

Figure 4:
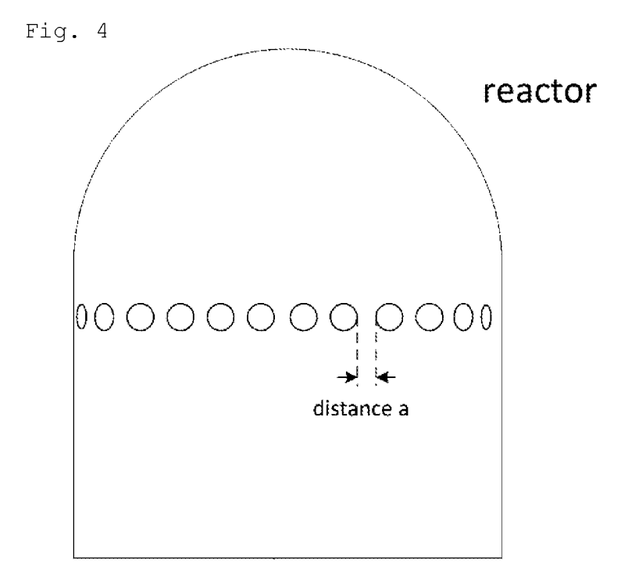
FIG. 4 illustrates an embodiment showing hole spacing.

Preferably, the gas inlet orifices, called holes hereinafter, are arranged in horizontal planes in the reactor wall (=row of gas inlet orifices or row of holes) (see FIG. 4).

Figure 6:
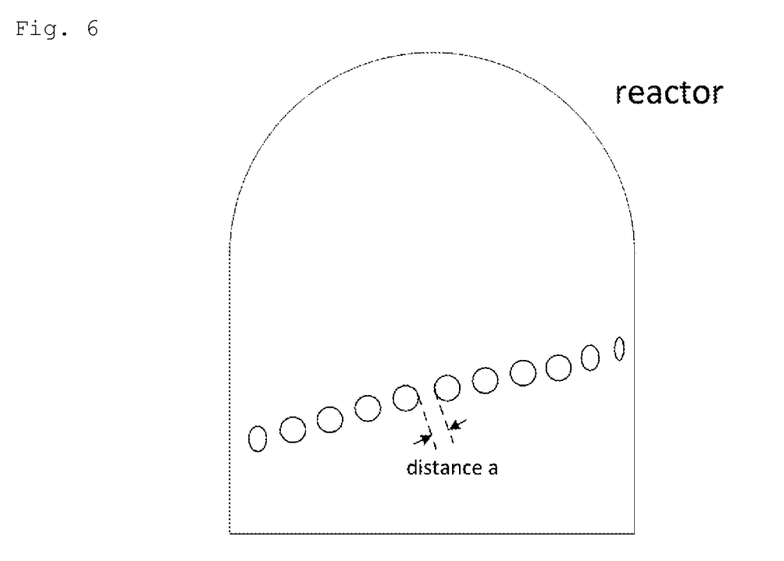
FIG. 6 illustrates an embodiment where nozzles for entry of reaction gas form a spiral along the reactor wall.

A further embodiment of the row of holes is that of holes arranged in the form of a screw over the circumference (see FIG. 6). However, combinations of various rows of holes in one reactor are also conceivable.

Individual rows of holes or several, optionally vertically offset rows of holes may be provided in the reactor wall.

Figure 5:
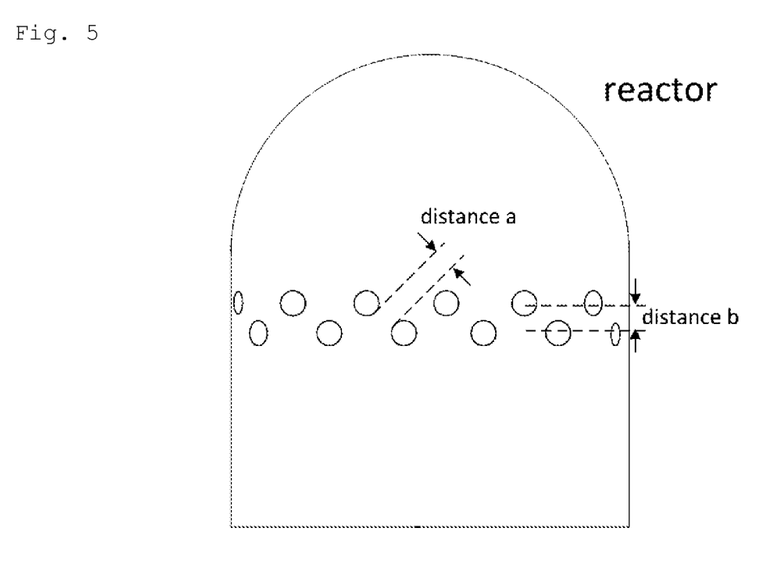
FIG. 5 illustrates an embodiment showing hole spacing and row spacing.
Figure 7:
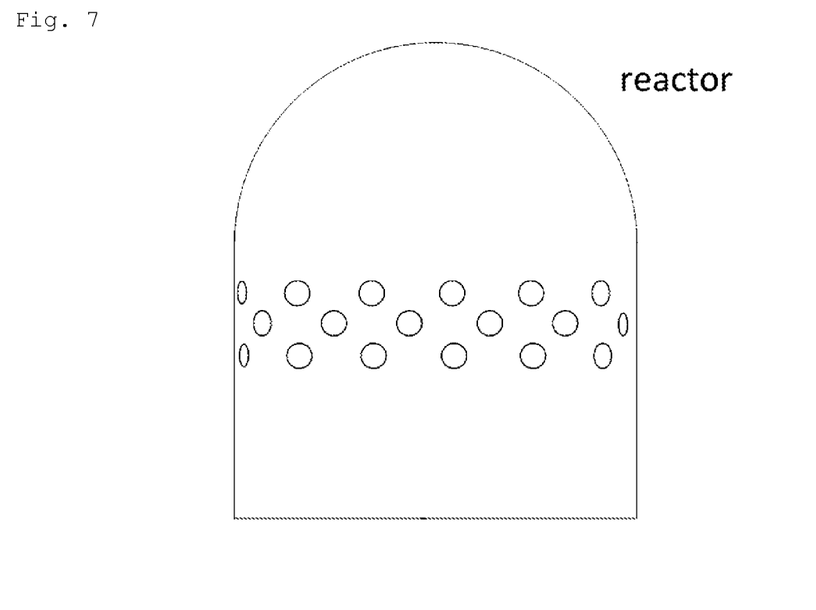
FIG. 7 illustrates an embodiment where staggered rows of injection nozzles are employed.

Especially rows of holes offset from one another in peripheral direction produce a continuous wall film (see FIGS. 5 and 7).

Preference is given to the combination of 2 to 4 rows of holes to form a hole block, more preferably of 2-3 rows of holes (see FIG. 7).

The vertical distance "b" between adjacent rows of holes is preferably a maximum of 5 reference hole diameters in each case (see FIG. 5).

Figure 8:
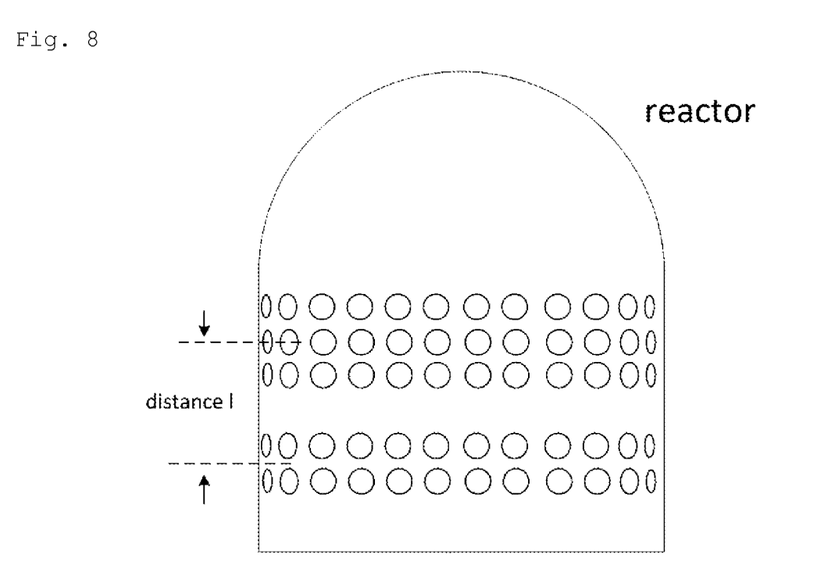
FIG. 8 illustrates an embodiment where two blocks of rows of injection nozzles are employed.

The following apply here:

Reference hole diameter=mean hydraulic diameter of all individual holes in the vertical reactor wall $$D_H = 4 \times \left( \sum_i A_i \Big/ \sum_i U_i \right)$$

where $D_H$=hydraulic reference hole diameter $A_i$=cross-sectional area of the individual hole i in the vertical reactor wall $U_i$=circumference of the individual hole i in the vertical reactor wall Preference is given to at least 2 blocks of holes having a distance l from one another in vertical direction such that $0 < l/D < 1$, where D=internal reactor diameter (l=center line of hole block A to center line of hole block B, see FIG. 8).

Particular preference is given to 2-4 blocks of holes.

More preferably, the distance l between the blocks satisfies the condition $0.2 < l/D < 0.8$; and most preferably $0.3 < l/D < 0.7$.

In addition to the holes in the cylindrical reactor wall, a portion of the reaction gas is introduced via nozzles in the base plate of the reactor.

The reaction gas which is introduced via the base plate flows upward in the middle via at least one nozzle in the center and optionally several nozzles in concentric circles in the base plate, and laterally downward at the reactor wall. The utilization of the nozzles in the base plate in addition to the lateral wall nozzles plays an important role in this context.

It is only through the combination of the base plate injection and the wall injection that the desired circulation flow is maintained and, at the same time, a wall film for minimization of the heat losses via the reactor wall is produced.

For minimization of wall heat losses, it is possible to dispense with the introduction of reaction gas via nozzles in the base plate toward the end of deposition.

The proportion of the reaction gas which is introduced via the reactor wall is preferably between 30 and 100 percent by mass, more preferably 50-90 percent by mass, based in each case on the total addition of reaction gas.

Optimized injection is achieved through division of the volume between base plate and wall which is variable during the process.

In this way, the wall film produced is ideally matched to the varying flow conditions in the reactor. A maximum reduction in the energy requirement for production of polysilicon is the consequence.

By virtue of this controlled introduction of the fresh gas directed downward on the inside of the reactor, the wall film (i.e. the gas flow directed downward close to the wall) is influenced in such a way that the total energy requirement of the reactor falls significantly.

A significant advantage of the invention is that the circulation flow in the reactor is maintained. In contrast, in the reactor according to JP2002241120 A2, for example, the circulation flow of the reaction gas is not promoted but hindered.

A further advantage of the invention is that only small amounts of fresh gas have to be injected via the base plates to maintain the circulation flow. The thermal stress on the silicon rods is distinctly reduced. Cracks and flaking can be minimized, and more homogeneous rod growth is possible. The total energy requirement of the process is significantly lowered.

The invention is illustrated hereinafter with reference to examples. Reference is also made again to FIGS. 1 to 8.

EXAMPLES

In a Siemens deposition reactor (see FIG. 1 to FIG. 8), polycrystalline silicon rods having a diameter between 150 and 170 mm were deposited.

At the same time, several variants for application of a wall film to the inner reactor wall were tested.

The parameters of the deposition process were the same in each of the experiments.

The experiments differ only in the geometry and position of the wall injectors, and in the mass flow division between base plate and wall injection.

The internal reactor diameter in each of the examples was 1.7 m.

The deposition temperature in the course of the batch was between 1000° C. and 1100° C.

During the deposition operation, the feed consisted of trichlorosilane, and hydrogen was added as carrier gas.

Example 1

Figure 1:
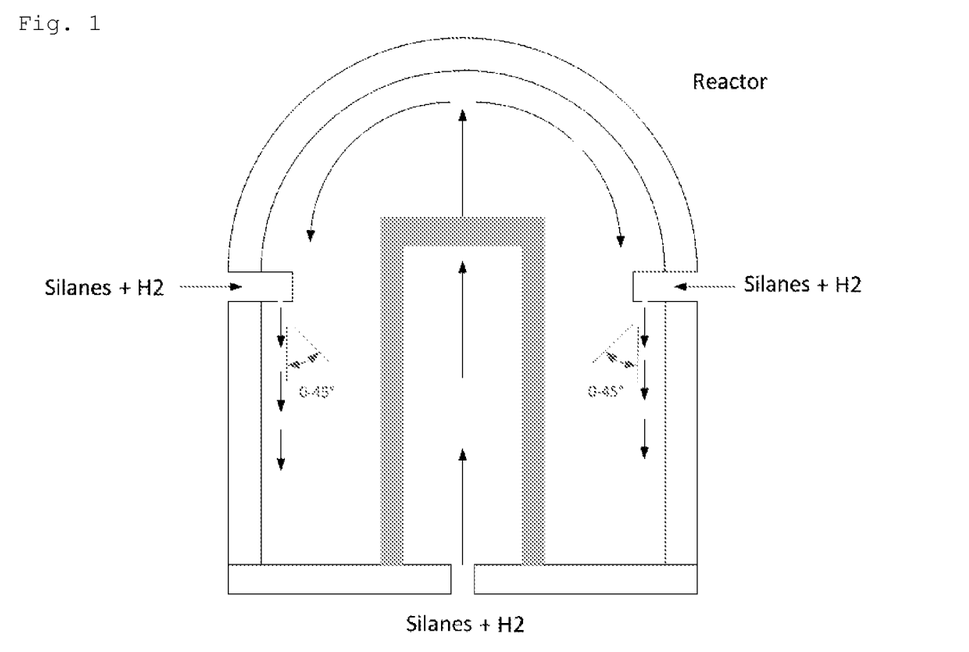
FIG. 1 illustrates one embodiment of the invention with reaction gas injected through the reaction wall at an angle of 0°.

CVD reactor configured according to FIG. 1.

In this variant, the wall film is introduced vertically downward, tangentially to the cylindrical region of the bell jar wall.

The injection was enabled by means of a retractable level having 240 cylindrical injectors distributed over the circumference.

The proportion of the total mass flow that was introduced at the wall was between 60% and 90%, depending on the deposition time (beginning at 60%, ending at 90%).

$(A_{inl.})/(A_{reac})=1/20{,}000.$

The distance of the wall inlet holes from the base plate was 2.3 m.

5 batches were run.

At the final diameter, an average reduction in the electrical power consumption of 7% was measured compared to the injection of the total amount of feed via the base plate.

Example 2

Figure 2:
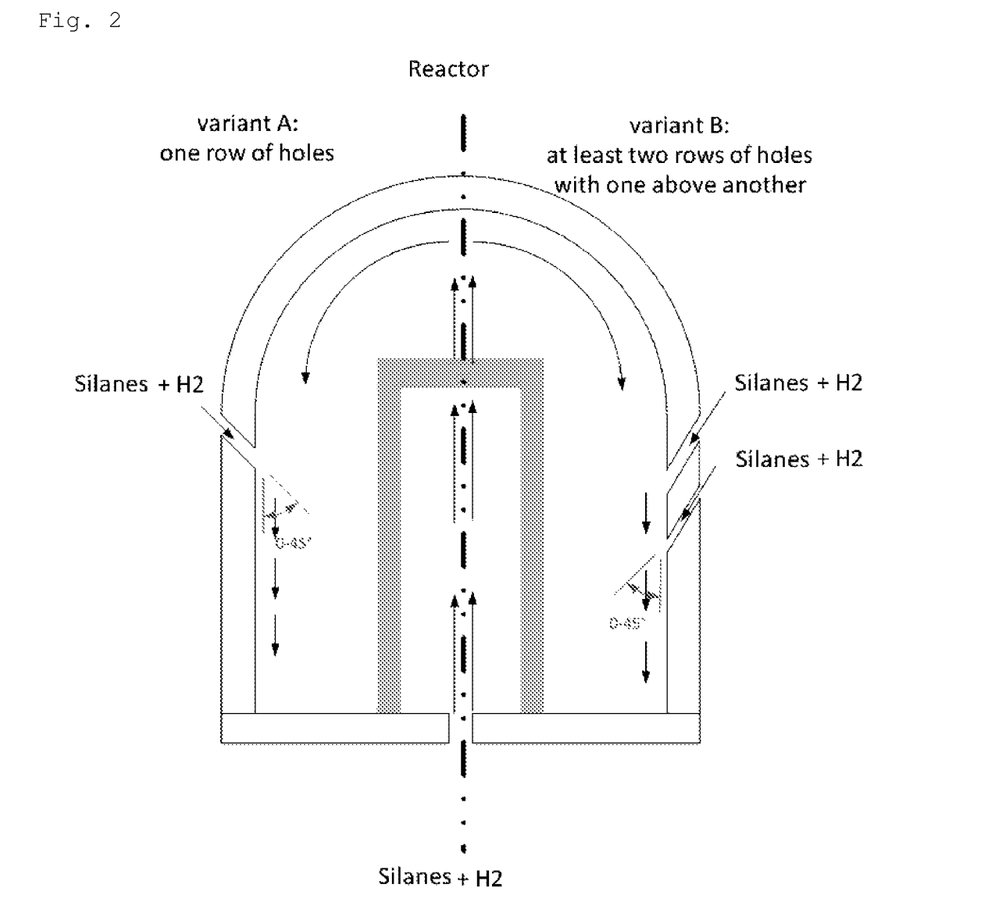
FIG. 2 illustrates two embodiments of the invention, with one row and two rows, respectively, of reaction gas inlet holes.
Figure 3:
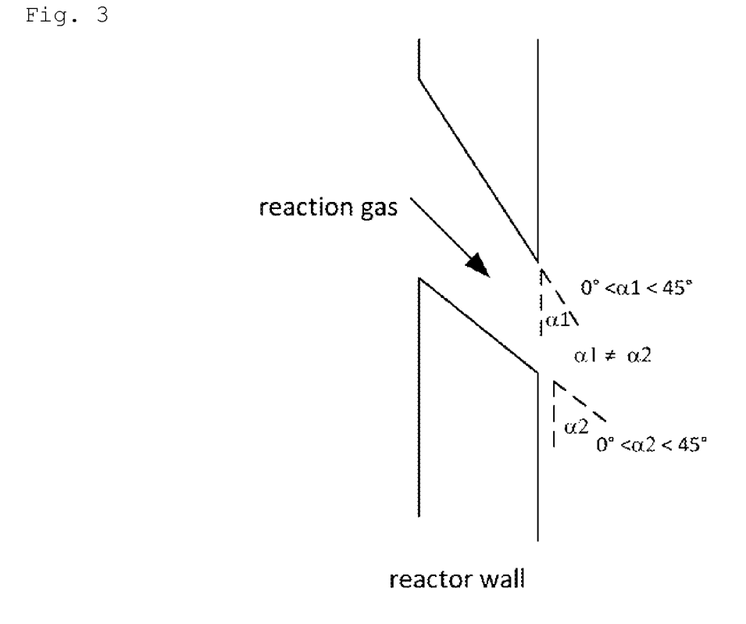
FIG. 3 illustrates an embodiment having inlet holes with different internal angles.

CVD reactor configured with variant A from FIG. 2.
Positioning of the holes according to FIG. 4.

In this variant, the wall film is introduced through a row comprising 180 holes distributed over the circumference at an angle of 25°.

$(A_{inl.})/(A_{reac})=1/7000.$

The distance of the entry holes from the base plate was 2.0 m.

The proportion of the total mass flow introduced at the wall was between 50% and 90% depending on the deposition time (beginning at 50%, ending at 90%).

10 batches were run.

At the final diameter, an average reduction in the electrical power consumption of 5% was measured compared to the injection of the total amount of feed via the base plate.

Example 3

CVD reactor configured with variant B from FIG. 2.
Positioning of the holes according to FIG. 8.

In this variant, the wall film is introduced into the reactor at the bell jar wall via two blocks of offset rows of holes, each of 360 holes at an angle of 20°.

Each block consists of 3 rows of holes, each of 120 holes. The rows of holes each had a vertical distance of 3 hole diameters from one another.

The ratio l/D was 0.5.

$(A_{inl.})/(A_{reac})=1/44{,}000$

The distance between the base plate and the middle of the first block of holes was 2.2 m.

The distance between the base plate and the middle of the second block of holes from the base plate was 1.35 m.

The proportion of the mass flow introduced at the wall was between 50% and 90% depending on the deposition time (beginning at 50%, ending at 90%).

6 batches were run.

At the final diameter, an average reduction in the electrical power consumption of 11% was measured compared to the injection of the total amount of feed via the base plate.

The invention claimed is:

1. A process for depositing polycrystalline silicon in a reactor chamber bounded laterally by a reactor wall having a circumference, at the top by a reactor top, and at the bottom by a base plate on which are mounted filament rods which are heated, comprising introducing a silicon-containing reaction gas mixture into the reactor chamber by means of gas inlet orifices on the reactor wall and in the base plate, and depositing silicon on the filament rods, wherein the silicon-containing reaction gas mixture is introduced towards the base plate at an angle of 0-45° relative to a lower portion of the lateral reactor wall through gas inlet orifices in the form of holes in the reactor wall.

2. The process of claim 1, wherein a ratio $A_{inl}/A_{reac}$ between the area of an individual inlet orifice $A_{inl}$ in the reactor wall and a cross-sectional area of the reactor interior $A_{reac}$ is greater than 10' and less than 1/1600.

3. The process of claim 1, wherein gas inlet orifices are distributed in a uniform, spaced-apart relationship around the circumference of the reactor wall.

4. The process of claim 1, wherein a direct distance a between adjacent gas inlet orifices in the reactor wall is at least 3 mm.

5. The process of claim 1, wherein gas inlet orifices in the reactor wall, proceeding from the base plate and based on the vertical length of the lateral reactor wall between the base plate and the reactor top, are within a region lying between 40% and 100% of the vertical length of the lateral reactor wall from the base plate.

6. The process of claim 1, wherein gas inlet orifices are present in the reactor wall in the form of vertically offset rows of holes, at least one row of holes comprising a plurality of spaced-apart holes positioned around the circumference of the reactor wall.

7. The process of claim 6, wherein at least two rows of holes are combined in each case to give at least two blocks of holes, where a distance l between every two blocks of holes satisfies the condition $0<l/D<1$, where D corresponds to an internal diameter of the reactor.

8. The process of claim 1, wherein mass flow rates of the silicon-containing reaction gas mixture are varied during the process between an initial mass flow rate at the gas inlet orifices in the base plate and an initial mass flow rate at the gas inlet orifices in the reactor wall.

9. The process of claim 8, wherein at least 30 percent by mass of the reaction gas mixture introduced into the reaction chamber is introduced via gas inlet orifices in the reactor wall.

10. The process of claim 8, wherein the mass flow rate percentage of reaction gas flowing into the reaction chamber through gas inlet orifices in the reactor wall increases during deposition relative to the total mass flow rate of reaction gas into the reactor.

11. The process of claim 10, wherein a mass flow rate percentage of reaction gas flowing into the reaction chamber through the gas inlet orifices in the reactor wall increases from an initial percentage of 30% to 50% to a value higher than the initial value towards the end of the deposition, relative to the total mass flow of reaction gas into the reactor.

12. The process of claim 11, wherein the proportion of silicon-containing reaction gas mixture flowing through the gas inlet orifices in the reactor wall reaches 100% toward the end of the deposition.

* * * * *

UNITED STATES PATENT AND TRADEMARK OFFICE
CERTIFICATE OF CORRECTION

PATENT NO. : 9,738,530 B2
APPLICATION NO. : 14/777643
DATED : August 22, 2017
INVENTOR(S) : Goeran Klose et al.

It is certified that error appears in the above-identified patent and that said Letters Patent is hereby corrected as shown below:

Column 7, Line 6, Claim 2:
After "is greater than"
Delete "10'" and
Insert -- $10^{-6}$ --.

Signed and Sealed this
Fourteenth Day of November, 2017

Joseph Matal
*Performing the Functions and Duties of the*
*Under Secretary of Commerce for Intellectual Property and*
*Director of the United States Patent and Trademark Office*